(12) United States Patent
Cusinato et al.

(10) Patent No.: US 6,351,186 B1
(45) Date of Patent: Feb. 26, 2002

(54) OPERATIONAL AMPLIFIER WITH ENHANCED-GAIN OUTPUT STAGES

(75) Inventors: Paolo Cusinato, Levante; Gabriele Gandolfi, Siziano; VIttorio Colonna, Landriano; Davide Tonietto, Trazzano Sul Naviglio, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/564,060

(22) Filed: May 3, 2000

(30) Foreign Application Priority Data

May 3, 1999 (IT) .......................................... MI99A0947

(51) Int. Cl.[7] .............................. H03F 3/45; H03F 3/26
(52) U.S. Cl. ....................................... 330/255; 330/267
(58) Field of Search ................................ 330/253, 255, 330/261, 264, 267

(56) References Cited

U.S. PATENT DOCUMENTS 5,585,763 A * 12/1996 Navabi et al. .............. 330/255

* cited by examiner

Primary Examiner—Steven J. Mottola
(74) Attorney, Agent, or Firm—Lisa Jorgenson; Robert Iannucci; Seed IP Law Group, PLLC

(57) ABSTRACT

The invention relates to a Class AB operational amplifier providing both output gain enhancement and adaptative output bias. The operational amplifier includes first and second output terminals; a main differential stage having first and second differential inputs and a first differential output stage; a first adaptatively biased, boosted output stage coupling the first differential output stage to the output terminal. Each output stage includes a first NMOS output transistor having a control terminal, a first terminal coupled to the respective output terminal, and a second terminal, and includes a first output amplifier having a first input coupled to the second terminal of the first output transistor, a second input coupled to the first differential output stage to provide adaptative bias for the first boosted output stage, and an output coupled to the control terminal of the first output transistor.

15 Claims, 5 Drawing Sheets

OPERATIONAL AMPLIFIER WITH ENHANCED-GAIN OUTPUT STAGES

FIELD OF THE INVENTION

This invention relates to operational amplifiers, and in particular to operational amplifiers having enhanced-gain output stages.

BACKGROUND OF THE INVENTION

The high-speed analog-to-digital converters (ADC) and digital-to-analog converters (DAC) for telecommunications use require very short linear adaptation times in order to drive large capacitive switching loads and attain high resolution.

Single-stage structures are needed to obtain a very wide band and fast adaptation. Major sources of problems with such structures are the low DC gain provided by conventional single-stage amplifiers in a cascode configuration and the large amount of power dissipated by Class A amplifiers.

To obviate the problem of a low DC gain, several structures with an enhanced-gain output stage have been proposed. An article "A CMOS Operational Amplifier with Fully-Differential Gain-Enhancement" by Lloyd and Lee, IEEE Trans. On Circuits and Systems, Vol. 41, No. 3, March 1994, pages 241–243, discloses an efficient way of enhancing gain without incurring losses in the rail-to-rail output operation.

One problem with that structure is its Class A mode of operation resulting in large power consumption. Another problem is the fixed output bias. Both are constraints that limit the adaptability of the output stage for a given bias current. No efficient way of obtaining a dynamic bias with this cascode structure has been found. In addition, the buffer states employed with the enhanced-gain stages comprise differential PMOS stages and a single NMOS stage. This restricts the phase margin achievable for a given bandwidth, due to PMOS transistors being slower than NMOS transistors at the same bias current.

A single-stage Class AB structure directed to obviate the problem of a high consumption is disclosed in Castello and Gray, "A High Performance Micropower Switched Capacitor Filter", IEEE J. Solid State Circuits, Vol. SC-20, Dec. 1985, pages 1122–1132. This article discloses a highly efficient way of obtaining Class AB operability and adaptative bias. However, no provision for boosting is given.

SUMMARY OF THE INVENTION

One embodiment of the invention concerns an operational amplifier providing both gain enhancement and adaptative biasing of the output stage.

The operational amplifier includes: a first output terminal; a main differential stage having first and second differential inputs and a first differential output stage; and a first output stage which is boosted and biased adaptatively to couple the first differential output stage to the output terminal. The first boosted output stage includes a first output transistor having a control terminal, a first terminal coupled to the first output terminal, and a second terminal; and a first output amplifier having a first input coupled to the second terminal of the first output transistor, a second input coupled to the first differential output stage to adaptatively bias the first boosted output stage, and an output coupled to the control terminal of the first output transistor.

Another embodiment of the invention concerns an operational amplifier which includes a first output terminal and a main differential stage having first and second inputs and first and second differential outputs. A first boosted output stage couples the output of the first differential stage to the output terminal and includes a first differential output stage having first and second N-channel transistors connected together into a differential configuration. A second boosted output stage couples the output of the second differential stage to the first output terminal and includes a second differential output stage having third and fourth N-channel transistors connected together into a differential configuration.

A further embodiment of the invention concerns an operational amplifier which includes a first output terminal; a main differential stage having first and second differential inputs, and a first differential output stage; and a first boosted output stage coupling the first differential output stage to the output terminal. The first boosted output stage includes a first output transistor having a control terminal, a first terminal coupled to the first output terminal, and a second terminal; and a first output amplifier having first and second N-channel transistors connected into a differential configuration, and a P-channel transistor having a control terminal coupled to the second terminal of the first output transistor, a first terminal whereat shifted level bias is produced, and a second terminal coupled to a first voltage reference. The first N-channel transistor has a control terminal coupled to a first bias voltage reference, and the second N-channel transistor has its control terminal coupled to the first terminal of the P-channel transistor.

DETAILED DESCRIPTION

Figure 1A:
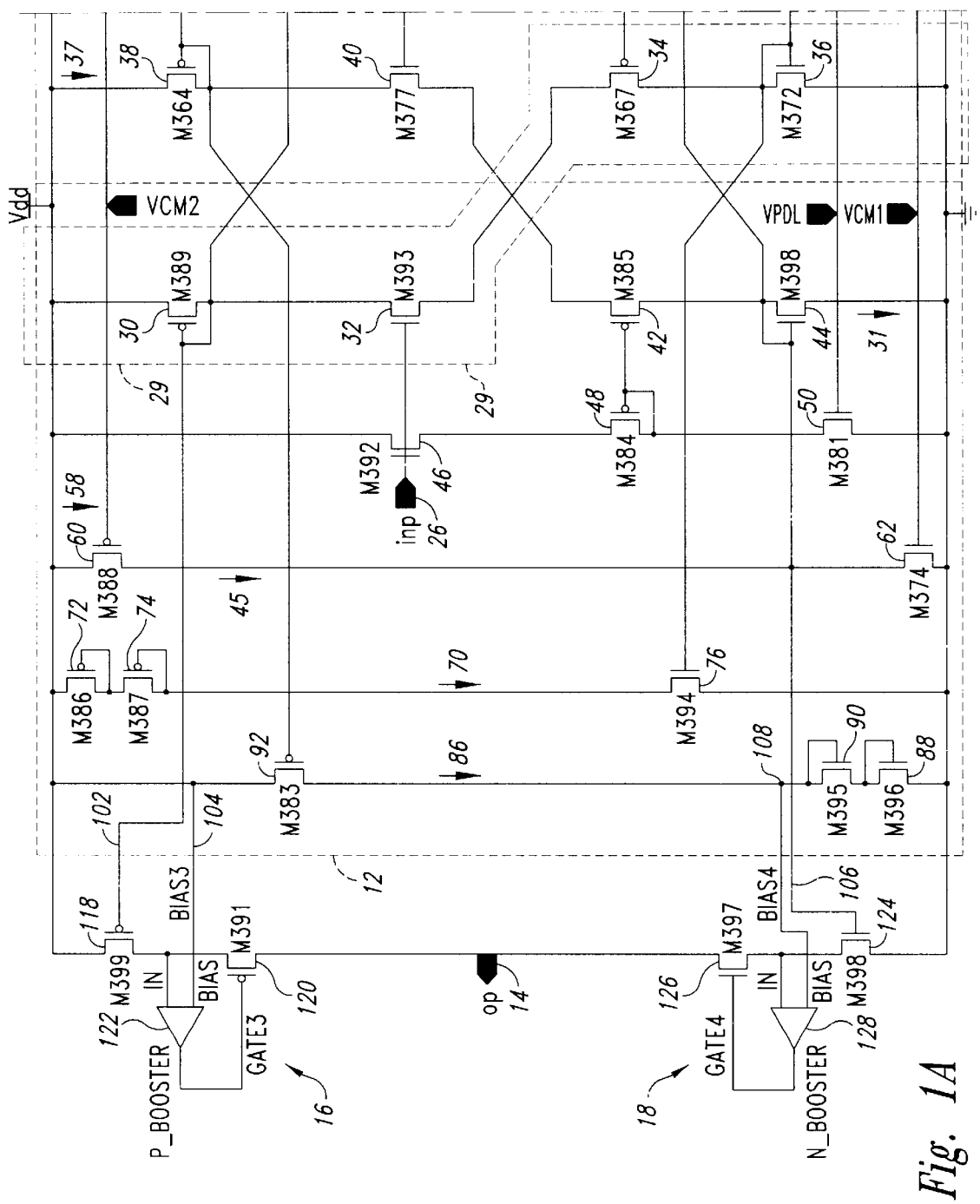
FIG. 1 is a circuit diagram of an operational amplifier according to an embodiment of this invention.
Figure 1B:
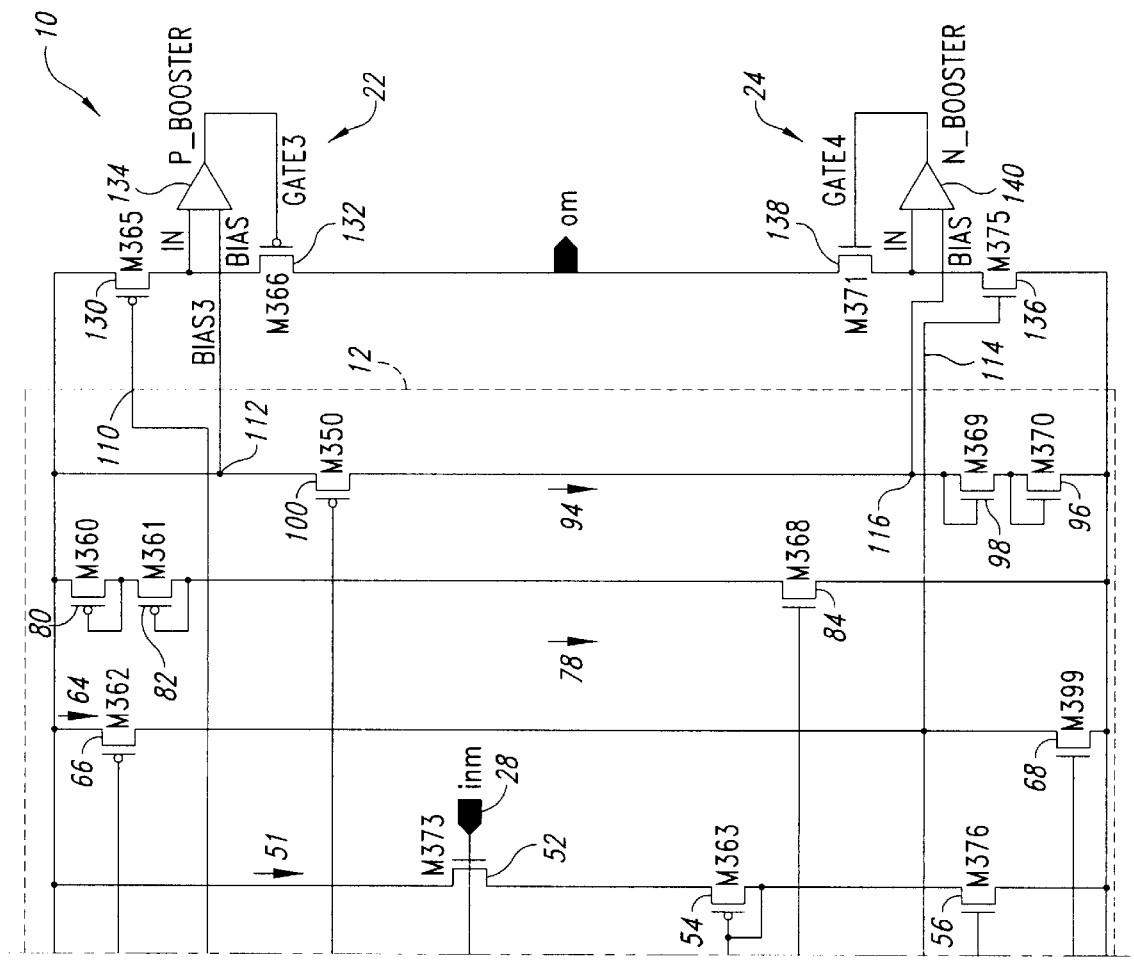

An embodiment of this invention is a Class AB operational amplifier (opamp) 10 shown in FIG. 1. It can be seen from FIG. 1 that the amplifier 10 is symmetrical about a midline AA. By adopting a Class AB configuration, the amplifier 10 can have reduced quiescent power with no speed tradeoff.

As discussed in greater detail hereinafter, the opamp incorporates novel boosted output stages achieving enhanced gain faster than prior art amplifiers. In addition, the output stages are biased adaptatively to provide maximum drive current, as well as maximum oscillation voltage and a faster response to an increase in current.

The opamp 10 includes a main differential stage 12 which is coupled to a first output terminal 14 via first and second output stages 16 and 18, and coupled to a second output terminal 20 via third and fourth output stages 22 and 24. The main differential stage 12 has a non-inverting input terminal 26 and an inverting input terminal 28 on which differential input signals are received. Enhanced-gain differential output signals are produced on the first and second output terminals 14 and 20 according to the differential input signals.

The main differential stage 12 has a first current path 29, extending between 3a voltage Vdd source and ground, which includes a P-channel diode 30 coupled in series with a first N-channel input transistor 32, a P-channel transistor 34, and an N-channel diode 36.

A second current path 37 between the voltage Vdd source and ground includes a P-channel diode 38 coupled in series with a second N-channel input transistor 40, a P-channel transistor 42, and an N-channel diode 44.

The first input transistor 32 has its gate terminal coupled to the non-inverting input terminal 26, and the second input transistor 40 has its gate terminal coupled to the inverting input terminal 28.

A third current path 45 is coupled in parallel with the first current path and includes an N-channel transistor 46 placed in series with a P-channel diode 48 and an N-channel transistor 50. The N-channel transistor 46 has its gate terminal coupled to the non-inverting input terminal 26 and the gate terminal of the first input transistor 32. The N-channel transistor 50 has its gate terminal coupled to a first fixed bias reference VPOL of 0.9V in a first embodiment.

Likewise, a fourth current path is coupled in parallel with the second current path and includes an N-channel transistor 52 in series with a P-channel diode 54 and an N-channel transistor 56. The N-channel transistor 52 has its gate terminal coupled to the inverting input terminal 28 and the gate terminal of the second input transistor 40. The N-channel transistor 56 has its gate terminal coupled to the first fixed bias reference VPOL.

A fifth current path 58, extending between the supply Vdd and ground, includes a P-channel transistor 60 which is coupled in series with an N-channel transistor 62. Similarly a sixth current path 64 includes a P-channel transistor 66 which is coupled in series with an N-channel transistor 68. The N-channel transistors 62 and 68 have their gate terminals coupled to a second fixed bias reference VCM1, and the P-channel transistors 60 and 66 have their gate terminals coupled to a third fixed bias reference VCM2.

A seventh current path 70 from the supply Vdd to ground includes two P-channel diodes 72, 74 which are coupled in series with an N-channel transistor 76. An eighth current path 78 similarly includes two P-channel diodes 80, 82 and an N-channel transistor 84.

The N-channel transistor 76 has its gate terminal coupled to respective drain terminals of the P-channel transistor 34 and the N-channel diode 36 of the first current path 29. The N-channel transistor 84 has its gate terminal coupled to respective drain terminals of the P-channel transistor 42 and the N-channel diode 44 of the second current path 37.

A ninth current path 86 from the supply Vdd to ground includes two N-channel diodes 88, 90 coupled in series with a P-channel transistor 92. Likewise, a tenth current path 94 includes two N-channel diodes 96, 98 and a P-channel transistor 100.

The P-channel transistor 92 has its gate terminal coupled to respective drain terminals of the P-channel diode 38 and the N-channel transistor 40 of the second current path 37. The P-channel transistor 100 has its gate terminal coupled to respective drain terminals of the P-channel diode 30 and the N-channel transistor 32 of the first current path 29.

The main differential stage 12 has first and second outputs, 102 and 104, coupled to the first output stage 16; third and fourth outputs, 106 and 108, coupled to the second output stage 18; fifth and sixth outputs, 110 and 112, coupled to the third output stage 22, and seventh and eighth outputs, 114 and 116, coupled to the fourth output stage 24.

The first and fifth outputs 102, 110 are coupled to respective drain terminals of the P-channel diodes 30, 38; the second and sixth outputs 104, 112 are coupled to respective drain terminals of the N-channel transistors 76, 84; the third and seventh outputs 106, 114 are coupled to respective gate terminals of the N-channel diodes 44, 36; and the fourth and eighth outputs 108, 116 are coupled to respective drain terminals of the P-channel transistors 92, 100.

The first output stage 16 includes two P-channel transistors 118, 120 which are connected in series between the supply Vdd and the first output terminal 14. The P-channel transistor 118 has its gate terminal coupled to the first output 102 of the differential stage. Furthermore, a first output amplifier 122 has the first input terminal IN coupled to the drain of the P-channel transistor 118 and coupled to the source of the P-channel transistor 120; has a second input terminal BIAS coupled to the second output 104 of the differential stage; and has an output terminal coupled to the gate of the P-channel transistor 120.

The second output stage 18 includes two N-channel transistors 124, 126 which are connected in series between ground and the first output terminal 14. The N-channel transistor 124 has its gate terminal coupled to the third output 106 of the differential stage. Also, a second output amplifier 128 has the first input terminal IN coupled to the drain of the N-channel transistor 124 and coupled to the source of the N-channel transistor 126; has a second input terminal BIAS coupled to the fourth output 108 of the differential stage; and has an output terminal coupled to the gate of the N-channel transistor 126.

The third output stage 22 includes two P-channel transistors 130, 132 which are connected in series between the supply Vdd and the second output terminal 20. The P-channel transistor 130 has its gate terminal coupled to the fifth output 110 of the differential stage. Furthermore, a third output amplifier 134 has the first input terminal IN coupled to the drain of the P-channel transistor 130 and coupled to the source of the P-channel channel transistor 132; has a second input terminal BIAS coupled to the sixth output 112 of the differential stage; and has an output terminal coupled to the gate of the P-channel transistor 132.

The fourth output stage 24 includes two N-channel transistors 136, 138 which are connected in series between ground and the second output terminal 20. The N-channel transistor 136 has its gate terminal coupled to the seventh output 114 of the differential stage. Also, a fourth output amplifier 140 has the first input terminal IN coupled to the drain of the N-channel transistor 136 and coupled to the source of the N-channel transistor 138; has a second input terminal BIAS coupled to the eighth output 116 of the differential stage; and has an output terminal coupled to the gate of the N-channel transistor 138.

The operation of the opamp 10 will now be described. In response to a broad positive differential input signal to the input terminals 26, 28, the current through the first input transistor 32 will rise substantially, whereas the current through the second input transistor 40 is substantially zero.

The current in the first current path 29 creates a voltage across the N-channel diode 36 which drives the N-channel transistor 76, causing a corresponding current to flow in the seventh path 70. The current in this seventh path 70 creates a voltage across the P-channel diodes 72, 74 which is fed into the first output amplifier 122. This voltage is amplified by the first output amplifier 122, which will drive the P-channel output transistor 120 and produce a deep positive voltage variation at the first output terminal 14.

The current in the first current path 29 also creates a voltage across the P-channel diode 30 which will drive the P-channel transistor 100 and produce a corresponding current flow in the tenth current path 94. The current in the tenth path 94 creates a voltage across the two N-channel diodes 96, 98 which is fed into the fourth output amplifier 140. This voltage is amplified by the fourth output amplifier 140, which will drive the N-channel output transistor 138 and push the second output terminal 20 to ground, thereby establishing a deep voltage differential between the first 14 and the second 20 output terminal.

Since substantially zero current is flowing along the second current path 37 in response to a broad positive differential input signal, substantially zero current will be flowing along the eighth and ninth paths of the second and third output stages 18, 22 presently inactive. As a result, the output terminals 14 and 20 will be driven by the first and the fourth stage 16, 24 only. Understandably, in response to a broad negative differential input signal to the input terminals 26, 28, the situation would be reversed, and the second and third output stages 18, 22 would produce a broad negative differential output signal at the output terminals 14, 20.

By having the second input terminals BIAS of the output amplifiers 122, 128, 134, 140 coupled to the varying biases of the second, fourth, sixth and eighth outputs 104, 108, 112, 116, respectively, of the differential stage, rather than to a fixed bias reference as in the prior art, the boosted output stages allow the output stages 16, 18, 22, 24 to obtain simultaneously a good voltage swing at the terminals 14, 20, and fall current driving capabilities.

In addition, a more effective dynamic bias is obtained with the output stages 16, 18, 22, 24 than with conventional AB amplifiers. In fact, by virtue of the gain introduced by the boosted stages 16, 18, 22, 24, the voltage will change each time that the second input terminal BIAS is amplified and passed to the respective output transistors 120, 126, 132, 138, thereby enabling these output transistors to respond more promptly to a sharp variation in current.

Figure 2:
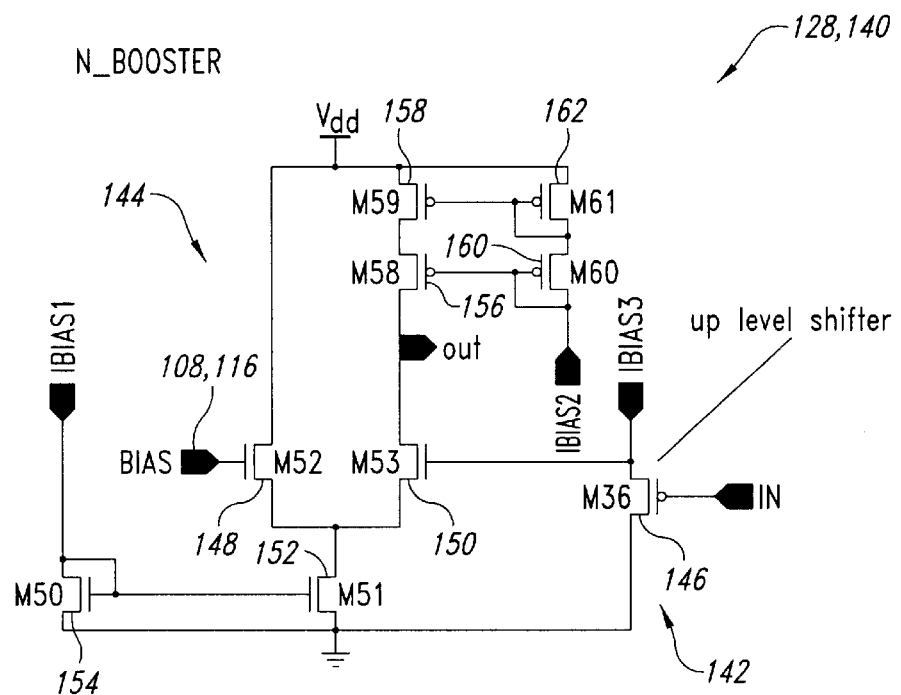
FIG. 2 is a circuit diagram of a first output amplifier of the amplifier shown in FIG. 1.

A circuit diagram for the second and fourth output amplifiers 128, 140 is shown in FIG. 2. The second and fourth output amplifiers 128, 140 include each an input level shifter 142 and a differential output stage 144. The level shifter 142 includes a P-channel transistor 146 having its gate terminal coupled to the first input IN of the output amplifier 128, 140, source coupled to a current bias reference IBIAS3 (e.g., 500 μA), and drain coupled to ground. Consequently, an input received on the first input IN would reflect in an up-shifted signal being produced at the source of the P-channel transistor 146.

The differential output stage 144 includes first and second N-channel differential transistors 148, 150, which have their source terminals jointly coupled to ground via an N-channel transistor 152. The N-channel transistor 152 is kept conducting by an N-channel diode 154 having its drain and gate terminals coupled to the gate terminal of the N-channel transistor 152. The N-channel diode 154 is coupled between a current bias reference IBIAS1 (e.g., 500 μA) and ground.

The first differential transistor 148 has its source terminal coupled directly to Vdd, whereas the second differential transistor 150 has its source terminal coupled to Vdd through two P-channel transistors 156, 158. The source of the second differential transistor 150 also functions as an output for the output amplifiers 128, 140. The two P-channel transistors 156, 158 form one leg of a current mirror having another leg formed of two P-channel diodes 160, 162 which are supplied a current bias reference IBIAS2 (e.g., 250 μA).

Figure 3:
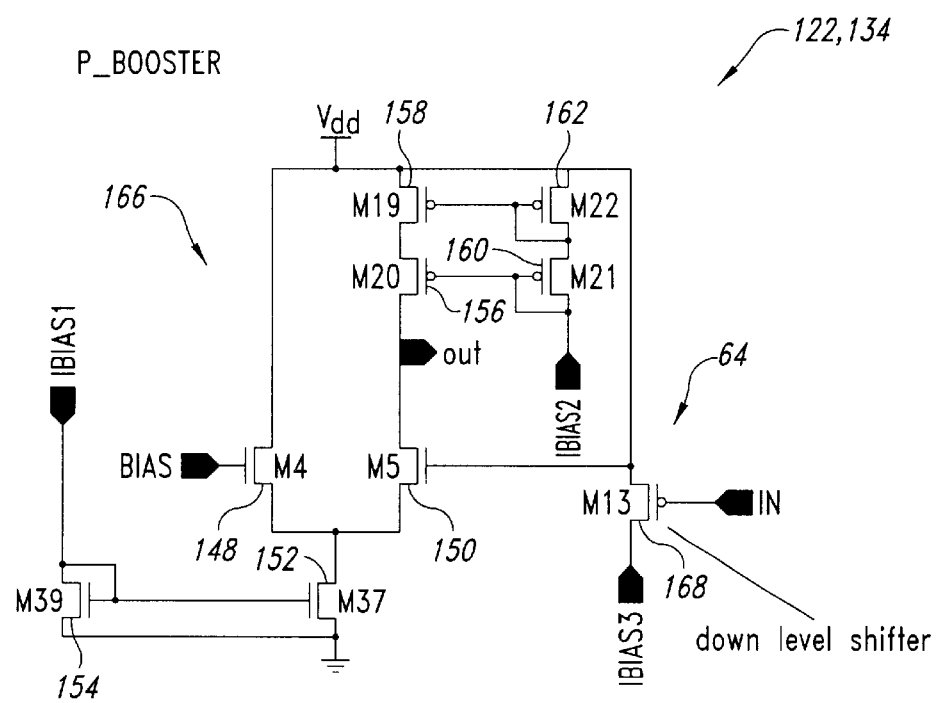
FIG. 3 is a circuit diagram of a second output amplifier of the amplifier shown in FIG. 1.

A circuit diagram for the first and third output amplifiers 128, 140 is shown in FIG. 3. Like the second and fourth output amplifiers 122, 134, the first and third output amplifiers 128, 140 include each an input level shifter 164 and a differential output stage 166. The circuits are identical, except that the level shifter 164 is now a down-shifter. In particular, the level shifter 164 includes an N-channel transistor 168 having its gate terminal coupled to the first input IN of the output amplifiers 122, 134, source coupled to a current bias reference IBIAS3 (e.g., 500 μA), and drain coupled to Vdd. As a result, an input received on the first input IN would cause a down-shifted signal to appear at the source of the N-channel transistor 168. By reason of the differential stage 166 being identical with the differential output stage 144 of FIG. 2, the circuit elements have been denoted with the same reference numerals.

The output stages 16, 18, 22, 24 provide gain enhancement at a faster rate than conventional output stages. This faster enhancement feature is the outcome of using N-channel transistors, instead of the P-channel differential transistors used in the prior art, for the differential transistors 148, 150 in each of the output stages 16, 18, 22, 24.

For a given bias current, an NMOS differential stage shows to be faster than a PMOS stage. The N-channel transistors 148, 150 can be used in the second and fourth amplifiers 128, 140, since these amplifiers incorporate the level up-shifter.

In addition, by using NMOS differential stages in each output amplifier, enhanced-gain output amplifiers can be obtained which are truly speed-symmetrical. This reflects in highly linear adaptation and improved frequency response from the overall amplifier 10 operation.

The differential output stage 144 includes first and second N-channel differential transistors 148, 150 which have their source terminals jointly coupled to ground via an N-channel transistor 152. The N-channel transistor 152 is kept conducting by an N-channel diode 154 which has its drain and gate terminals coupled to the gate terminal of the N-channel transistor 152. The N-channel diode 154 is coupled between a current bias reference IBIAS1 (e.g., 500 μA) and ground.

The first differential transistor 148 has its source terminal coupled directly to Vdd, whereas the second differential transistor 150 has the source terminal coupled to Vdd through two P-channel transistors 156, 158. The source of the second differential transistor 150 also functions as an output for the output amplifiers 128, 140. The two P-channel transistors 156, 158 form one leg of a current mirror which has another leg formed of two P-channel diodes 160, 162 being supplied a current bias reference IBIAS2 (e.g., 250μ).

Figure 4:
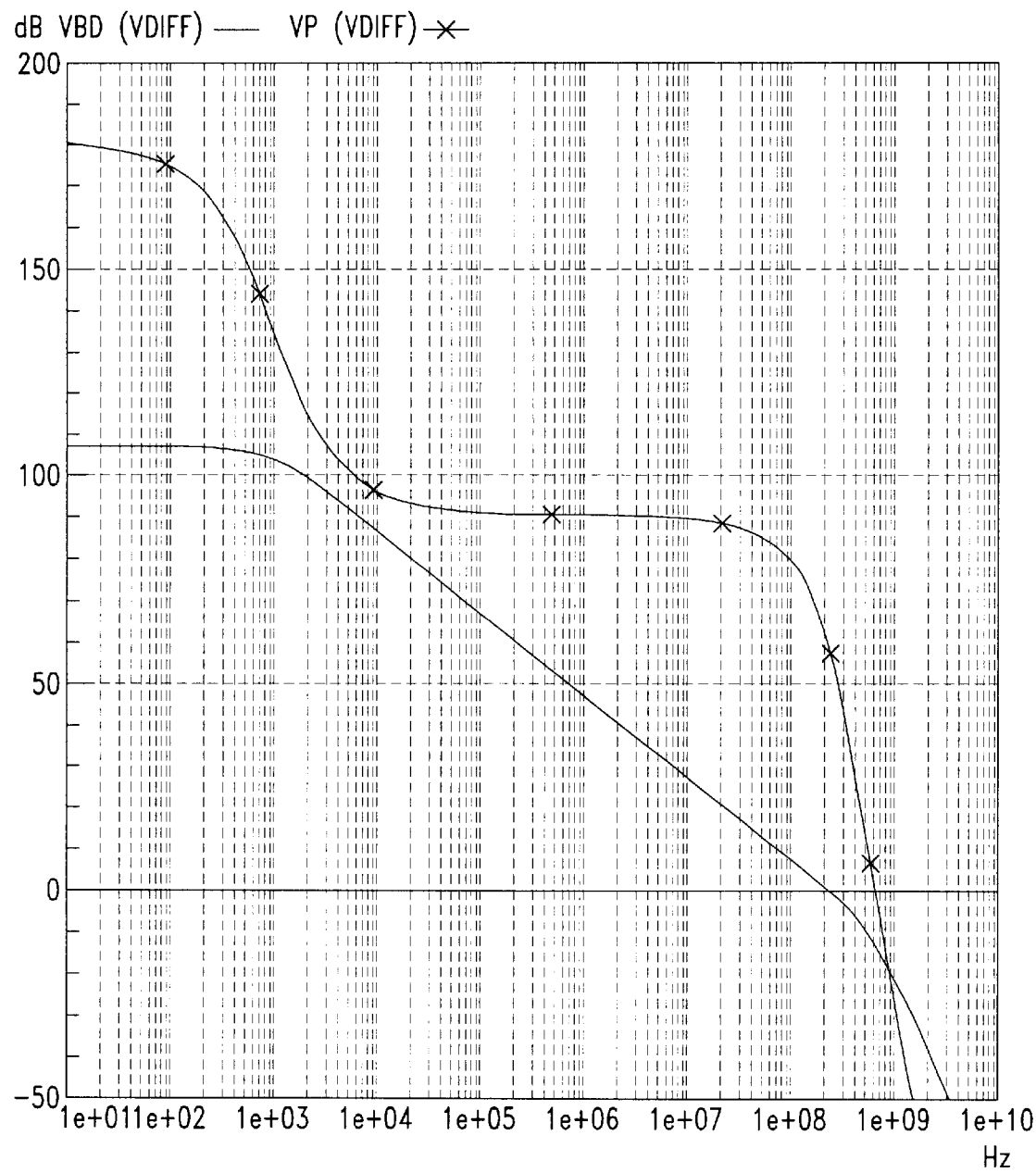
FIG. 4 is an exemplary graph of phase and amplitude vs. frequency at the output of the amplifier in FIG. 1.
Figure 5:
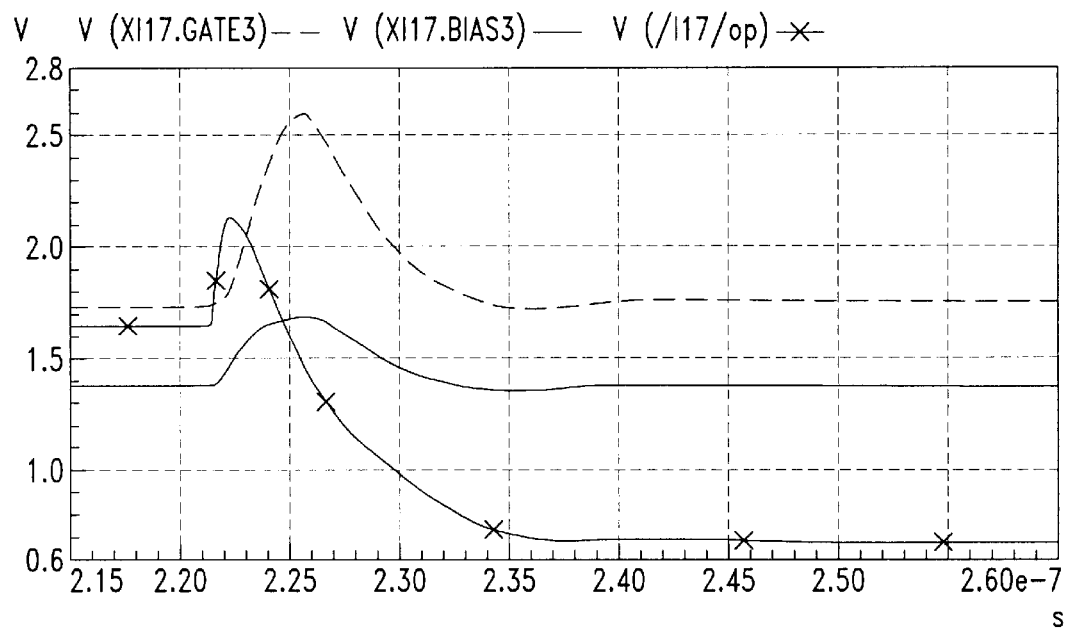
FIG. 5 is a graph of a voltage transient analysis of three nodes for the second output amplifier in FIG. 3.
Figure 6:
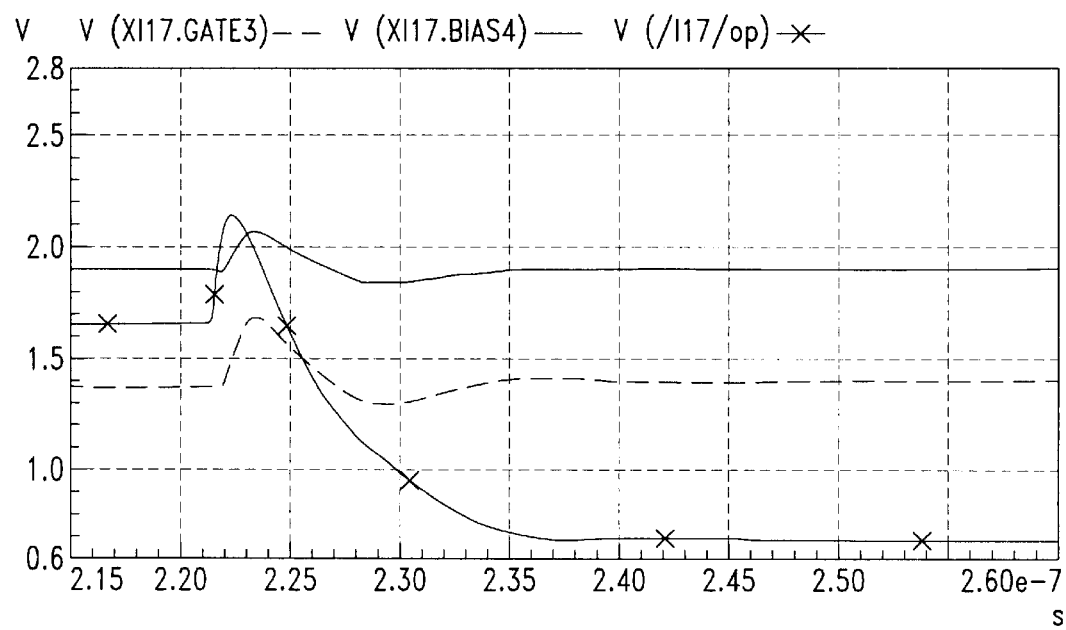
FIG. 6 is a graph of a voltage transient analysis of three nodes for the first output amplifier in FIG. 2.

An analysis of the operation of the amplifier 10 is given in FIGS. 4 to 6. FIG. 4 depicts the phase and amplitude of a differential voltage which is output from the first and second output terminals (Vop−Vom). FIG. 5 shows the voltage at the gate terminal of the P-channel transistor 120 (ghost line), the second output 104 from the differential stage (full line), and the first output terminal 14 (segmented line). FIG. 6 shows the voltage at the gate terminal of the N-channel transistor 126 (ghost line), the fourth output 198 from the differential stage (full line), and the first output terminal 14 (segmented line). These plots highlight the more effective dynamic bias, faster gain enhancement (FIGS. 5 and 6), and improved linear adaptation and frequency response of the whole operational amplifier according to the invention.

It can be appreciated from the foregoing that, while a specific embodiment has been described by way of example, several modifications can be made thereunto without departing from the spirit and the scope of the invention as defined in the appended claims.

What is claimed is:

1. An operational amplifier comprising:

a first output terminal;

a main differential stage having first and second differential inputs and a first differential output stage providing a first differential output;

a first output stage biased adaptatively to couple the first differential output stage to the first output terminal and structured to boost the first differential output and produce a boosted output signal at the first output terminal, and including:

a first output transistor having a control terminal, a first terminal coupled to the first output terminal, and a second terminal; and a first output amplifier having a first input coupled to the second terminal of the first output transistor, a second input coupled to the first differential output stage to adaptatively bias the first boosted output stage, and an output coupled to the control terminal of the first output transistor.

2. An operational amplifier comprising:

a first output terminal;

a main differential stage having first and second differential inputs and a first differential output stage;

a first output stage being boosted and biased adaptatively to couple the first differential output stage to the first output terminal, and including:

a first output transistor having a control terminal, a first terminal coupled to the first output terminal, and a second terminal; and a first output amplifier having a first input coupled to the second terminal of the first output transistor, a second input coupled to the first differential output stage to adaptatively bias the first boosted output stage, and an output coupled to the control terminal of the first output transistor; and the main differential stage including:

a first transistor having a control terminal coupled to the first differential input, a first terminal coupled to a first voltage reference, and a second terminal; and a second transistor having a control terminal, a first terminal coupled to the second terminal of the first transistor, and a second terminal coupled to a second voltage reference; and wherein the first boosted output stage further includes:

a second output transistor having a control terminal coupled to the control terminal of the second transistor, a first terminal coupled to the second terminal of the first output transistor, and a second terminal coupled to the second voltage reference.

3. The amplifier according to claim 1 wherein the main differential stage includes:

a first transistor having a control terminal coupled to the first differential input, and first and second terminals; and a second transistor having a control terminal coupled to the first terminal of the first transistor, a first terminal coupled to a first voltage reference, and a second terminal coupled to the second input of the first output amplifier.

4. An operational amplifier comprising:

a first output terminal;

a main differential stage having first and second differential inputs and a first differential output stage;

a first output stage being boosted and biased adaptatively to couple the first differential output stage to the first output terminal, and including:

a first output transistor having a control terminal, a first terminal coupled to the first output terminal, and a second terminal; and a first output amplifier having a first input coupled to the second terminal of the first output transistor, a second input coupled to the first differential output stage to adaptatively bias the first boosted output stage, and an output coupled to the control terminal of the first output transistor;

wherein the main differential stage includes a third transistor having a control terminal, a first terminal coupled to the second terminal of the first transistor, and a second terminal coupled to a second voltage reference; and wherein the first boosted output stage includes a second output transistor having a control terminal coupled to the control terminal of the third transistor, a first terminal coupled to the second terminal of the first output transistor, and a second terminal coupled to the second voltage reference.

5. The amplifier according to claim 2 wherein the main differential stage includes:

a third transistor having a control terminal coupled to the second differential input, and first and second terminals; and a fourth transistor having a control terminal coupled to the first terminal of the third transistor, a first terminal coupled to the first voltage reference, and a second terminal; the operational amplifier further comprising:

a second output terminal; and a second boosted output stage which is biased adaptatively and includes:

a second output transistor having a control terminal, a first terminal coupled to a second output terminal, and a second terminal; and a second output amplifier having a first input coupled to the second terminal of the second output transistor, a second input coupled to the second terminal of the fourth transistor to provide adaptative bias for the second boosted output stage, and an output coupled to the control terminal of the second output transistor.

6. An amplifying circuit comprising:

a differential stage having first and second differential inputs, and having first and second output stages; and first and second adaptively biased output stage boosters coupled respectively to the first and second output stages, each output stage booster including an output transistor and an output amplifier: and the output amplifier including:

a first input coupled to the output transistor;

a second input coupled to a respective one of the output stages;

a level shifter having an input coupled to the first input and an output at which a level shifted signal is produced; and a differential stage having a first differential input coupled to the output of the input level shifter and a second differential input coupled to the second input.

7. The amplifying circuit of claim 6 wherein the differential stage of the output amplifier comprises a first and a second N-channel differential transistor, the first N-channel differential transistor having a control terminal serving as the second input to the output amplifier, and the second N-channel differential transistor having a control terminal coupled to the level shifter.

8. The amplifying circuit of claim 6 wherein the second input to the output amplifier is capable of providing a non-static bias reference.

9. The amplifying circuit of claim 6 wherein the circuit is a class AB amplifier.

10. An amplifying circuit comprising:
   a differential stage having first and second differential inputs, and having first and second output stages;
   first and second adaptively biased output stage boosters coupled respectively to the first and second output stages, each output stage booster including an output transistor and an output amplifier, the output amplifier having a first input coupled to the output transistor, and having a second input coupled to a respective one of the output stages; and
   a first and a second circuit output terminal, wherein the output transistor of the output stage boosters includes a control terminal, a first terminal coupled to a respective circuit output terminal, and a second terminal; and wherein the output amplifier has an output coupled to the control terminal of the output transistor.

11. An amplifier comprising:
   a differential stage having first and second differential inputs, and having first and second output stages;
   first and second adaptively biased output stage boosters coupled respectively to the first and second output stages, each output stage booster including an output transistor and an output amplifier, the output amplifier having a first input coupled to the output transistor, and having a second input coupled to a respective one of the output stages: and
   the differential stage including:
      a first transistor having a control terminal coupled to the first differential input, a first terminal coupled to a first voltage reference, and a second terminal; and
      a second transistor having a control terminal, a first terminal coupled to the second terminal of the first transistor, and a second terminal coupled to a second voltage reference; and wherein the first and second output stages each further include:
      a second output transistor having a control terminal coupled to the control terminal of the second transistor, a first terminal coupled to the second terminal of the output transistor, and a second terminal coupled to the second voltage reference.

12. The amplifier according to claim 6 wherein the main differential stage includes:
   a first transistor having a control terminal coupled to the first differential input, and first and second terminals; and
   a second transistor having a control terminal coupled to the first terminal of the first transistor, a first terminal coupled to a first voltage reference, and a second terminal coupled to the second input of the first output amplifier.

13. The amplifier according to claim 11 wherein the main differential stage includes a third transistor having a control terminal, a first terminal coupled to the second terminal of the first transistor, and a second terminal coupled to a second voltage reference; and wherein the first output stage includes a second output transistor having a control terminal coupled to the control terminal of the third transistor, a first terminal coupled to the second terminal of the output transistor, and a second terminal coupled to the second voltage reference.

14. The amplifier according to claim 11 wherein the main differential stage includes:
   a third transistor having a control terminal coupled to the second differential input, and first and second terminals; and
   a fourth transistor having a control terminal coupled to the first terminal of the third transistor, a first terminal coupled to the first voltage reference, and a second terminal.

15. The amplifier of claim 6 wherein the level shifter includes a transistor having a control terminal coupled to the first input of the output amplifier, a first conduction terminal coupled to a bias voltage and to the first differential input of the differential stage of the output amplifier, and a second conduction terminal coupled to a reference voltage.

* * * * *

UNITED STATES PATENT AND TRADEMARK OFFICE
CERTIFICATE OF CORRECTION

PATENT NO.    : 6,351,186 B1
DATED         : February 26, 2002
INVENTOR(S)   : Paolo Cusinato et al.

It is certified that error appears in the above-identified patent and that said Letters Patent is hereby corrected as shown below:

<u>Title page,</u>
Item [75], the third and fourth listed inventor's data should read -- Vittorio Colonna, Landriano; Davide Tonietto, Trezzano Sul Naviglio --.

Signed and Sealed this

Twenty-first Day of May, 2002

Attest:

JAMES E. ROGAN
*Attesting Officer*   *Director of the United States Patent and Trademark Office*